United States Patent [19]

Harada

[11] Patent Number: 5,047,813

[45] Date of Patent: Sep. 10, 1991

[54] SEMICONDUCTOR DEVICE AND METHOD OF MANUFACTURING THE SAME

[75] Inventor: Masana Harada, Itami, Japan

[73] Assignee: Mitsubishi Denki Kabushiki Kaisha, Tokyo, Japan

[21] Appl. No.: 455,775

[22] Filed: Dec. 28, 1989

Related U.S. Application Data

[63] Continuation of Ser. No. 207,196, Jun. 16, 1988, abandoned.

[30] Foreign Application Priority Data

Aug. 19, 1987 [JP] Japan .................. 62-206857

[51] Int. Cl.$^5$ ............................................. H01L 29/10
[52] U.S. Cl. ..................................... 357/23.4; 357/90
[58] Field of Search .................... 357/23.4, 43, 34, 90

[56] References Cited

U.S. PATENT DOCUMENTS 4,587,713  5/1986  Goodman et al. ................. 357/23.4
4,684,413  8/1987  Goodman et al. ................. 357/23.4

FOREIGN PATENT DOCUMENTS 0229362  7/1987  European Pat. Off. .

OTHER PUBLICATIONS

"Insulated Gate Transistor Modeling and Optimization", IEDM Digest, Dec. 1984, 10.5, pp. 274–277, by Yilmay et al.

"Improved COMFETs with Fast Switching Speed and High-Current Capability", IEDM 83, 4.3, pp. 79–82, by Goodman et al., Dec. 1983.

"The Insulated Gate Transistor: A New Three-Terminal MOS-Controlled Bipolar Power Device", IEEE Transactions on Electron Devices, vol. ED-31, No. 6, Jun. 1984, pp. 821–828, by Baliga et al.

Primary Examiner—Mark Prenty
Attorney, Agent, or Firm—Oblon, Spivak, McClelland, Maier & Neustadt

[57] ABSTRACT

A base layer is formed as first and second base layers through two steps, so that only an upper base layer (second base layer) can be easily set in high impurity concentration dissimilarly to conventional one. As the result, a JFET effect can be suppressed. Further, first and second well regions are formed for the first and second base layer, respectively, to be coupled with each other to form a single well region, so that a lower well region (first well region) can be easily set higher in impurity concentration than an upper well region (second well region). As the result, a latch-up phenomenon can be prevented.

11 Claims, 2 Drawing Sheets

SEMICONDUCTOR DEVICE AND METHOD OF MANUFACTURING THE SAME

This application is a continuation of U.S. application Ser. No. 07/207,196, filed on June 16, 1988, now abandoned.

BACKGROUND OF THE INVENTION

1. Field of the Invention

The present invention relates to a semiconductor device with conductivity modulation, such as an insulated gate bipolar transistor.

2. Description of the Background Art

FIG. 1 is a sectional view showing the structure of a conventional vertical insulated gate bipolar transistor (IGBT) disclosed in IEDM Transactions 1984, pp. 274–277.

Referring to FIG. 1, a $p^+$-type collector layer 21 is formed by a $p^+$-type semiconductor substrate. An $n^-$-type base layer 22 is formed on one major surface of the $p^+$-type collector layer 21. A p-type impurity is selectively diffused in a partial region of the surface of the $n^-$-type base layer 22, to form a p-type well region 23. Further, an n-type impurity of high concentration is selectively diffused in a partial region of the surface of the p-type well region 23, to form an $n^+$-type emitter region 24. A gate insulation film 26 is formed on the surface of a channel portion 26 of the p-type well region 23 between the surfaces of the $n^-$-type base layer 22 and the $n^+$-type emitter region 24. The gate insulation film 26 is also formed on the surface of the $n^-$-type base layer 22 to be integrated with a gate insulation film of an adjacent IGBT cell. A gate electrode 27 of polysilicon, for example, is formed on the gate insulation film 26, while an emitter electrode 28 of metal such as aluminum is formed to be electrically connected to both of the p-type well region 23 and the $n^+$-type emitter region 24. A collector electrode 29 of metal is formed on the back surface of the $p^+$-type collector layer 21 in common with respect to all of the IGBT cells.

N channel MOS structure is provided in the vicinity of the channel portion 25. Thus, when positive voltage is applied to the gate electrode 27, electrons flow from the $n^+$-type emitter region 24 to the $n^-$-type base layer 22 through the channel portion 25. On the other hand, holes of minority carriers are injected from the $p^+$-type collector layer 21 into the $n^-$-type base layer 22. A part of the holes dissipate through recombination with the aforementioned electrons, while the remaining ones flow in the p-type well region 23 as hole current. Thus, the IGBT basically operates in a bipolar manner, and conductivity is increased by an effect of conductivity modulation in the $n^-$-type base layer 22, thereby lower ON-state voltage and larger current capacity can be implemented as compared with a general power MOB transistor.

In general, an IGBT is provided therein with a parasitic pnpn thyristor in structure, and hence a latch up phenomenon of such a parasitic thyristor must be suppressed. Therefore, operation of a parasitic bipolar transistor, which is formed by the $n^+$-type emitter region 24, the p-type well region 23 and the $n^-$-type base region 22, is generally suppressed.

In a method of suppressing the operation of such a parasitic bipolar transistor, the $n^+$-type emitter region 24 and the p-type well region 23 are short-circuited with each other, furthermore, impurity concentration of the p-type well region 23 is increased in order to let the holes, that is the minority carriers, gathering from the $n^-$-type base region 22 to the p-type well region 23, flow through the p-type well region 23 without turning on the parasitic bipolar transistor.

In this method, impurity concentration in forming the p-type well region 23 has been generally increased and deep diffusion has been performed at a high temperature for a long time, while impurity diffusion in high concentration has been repeated a plurality of times, as the case may be.

Increase in depth of the p-type well region 23 leads to improvement in peak inverse breakdown voltage of p-n junction formed by the p-type well region 23 and the base layer 22. Thus, deep formation of the p-type well region 23 Is required also in view of improvement in breakdown voltage of the device. For example, depth of 15 to 20 $\mu$m is required for the p-type well region 23 in a device of breakdown voltage of 1000 V.

In the method of increasing impurity concentration of the p-type well region 23, however, a defect such as thermal distortion is caused when heat treatment is performed at a high temperature for a long time. Further, concentration distribution of the impurity is inevitably reduced as depth is increased, since the p-type well region 23 is formed by diffusion from the surface of the $n^-$-type base layer 22. Thus, vertical resistance in the p-type well region 23 cannot be sufficiently reduced in its bottom portion, leading to insufficient prevention of a latch-up phenomenon.

In another method of suppressing operation of the parasitic bipolar transistor, the ratio of the surface of the $n^+$-type emitter region 24 within the surface of the p-type well region 23 is reduced to increase the ratio of holes flowing in the p-type well region 23 without passing under the $n^+$-type emitter region 24, i.e., to provide a bypass region. In particular, there is such possibility that large voltage drop caused by flow of a large amount of carriers through the well region 23 just below the $n^+$-emitter one 24 may bring the transistor into an ON state in the vicinity of an end portion of the $n^+$-emitter region 23 near the channel portion 25, even if resistance of the p-type well region 23 is small. The aforementioned method of providing the bypass region is effective to reduce such possibility. In this method, however, the area of the channel portion 25 is decreased, whereby current capacity is reduced.

Further, a problem other than the latch up phenomenon resides in a junction field effect transistor (JFET) effect caused between an adjacent pair of p-type well regions 23. In an IGBT, current flowing through the channel part 28 in an ON state flows through the $n^-$-type base layer 22 between the adjacent pair of p-type well regions 23. As a space between the adjacent pair of p-type well regions 23 becomes small, a depletion layer occupies more part of the $n^-$-type base layer 22 between the p-type well regions 23 to obstruct the flow of the current, whereby emitter collector resistance components of the IGBT are increased. This is the JFET effect. ON-state voltage of the IGBT is increased by such JFET effect.

In an IGBT of high breakdown voltage, particularly the substrate ($n^-$-type base region 22) of low impurity concentration, i.e., high specific resistance is used and the deep p-type well region 23 is formed, whereby the JFET effect is further facilitated. Hence the space between IGBT cells cannot be reduced. Thus, it is hard to increase current capacity by fining the cells to increase the cell density.

SUMMARY OF THE INVENTION

The present invention is directed to a semiconductor device with conductivity modulation, such as an IGBT.

In a first aspect, a semiconductor device according to the present invention comprises a first semiconductor layer of a first conductivity type, a second semiconductor layer of a second conductivity type formed on a surface of the first semiconductor layer, and a well region of the first conductivity type formed on the surface of the second semiconductor layer, which well region has a first region of relatively high impurity concentration at least in a lower part of the well region.

The semiconductor device further comprises a semiconductor region of the second conductivity type formed in a part of the surface of the well region separately from the second semiconductor layer, an insulation film formed on a surface of the well region between the semiconductor region and the second semiconductor layer, a control electrode formed on the surface of the insulation film, a first electrode formed on the semiconductor region and the well region and a second electrode formed on a back surface of the first semiconductor layer, in which the second semiconductor layer has a second region of relatively high impurity concentration in at least a part of a portion of a depth corresponding to the well region.

In a second aspect, a method of manufacturing a semiconductor device according to the present invention comprises the steps of preparing a first semiconductor layer of a first conductivity type, forming a second semiconductor layer of a second conductivity type on a surface of the first semiconductor layer, forming a first well region of the first conductivity type in a surface of the second semiconductor layer, forming another second semiconductor layer of the second conductivity type on the surfaces of the second semiconductor layer and the first well region, forming a second well region of the first conductivity type into the said another second semiconductor layer on the first well region, so that the second well region is coupled to the first well region, forming a semiconductor region of the second conductivity type in a surface of the second well region, forming an insulation film on the surface of the well region between the semiconductor region and the said another second semiconductor layer, forming a control electrode on a surface of the insulation film, forming a first electrode on the second well region, and forming a second electrode on a back surface of the first semiconductor layer.

Accordingly it is an object of the present invention to provide a semiconductor device with conductivity modulation, such as an insulated gate bipolar transistor, and a method of manufacturing the same, in which cells can be designed to have a large channel area without latch-up phenomenon.

It is another object of the present invention to provide a semiconductor device and a method of manufacturing the same, in which cells can be arranged in high density without increasing ON-state voltage in the case of increasing breakdown voltage.

These and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 2(a) to 2(f) are sectional views of cell structure showing a method of manufacturing an n-channel IGBT according to an embodiment of the present invention. Referring to FIGS. 2(a) to 2(f), manufacturing steps will be described.

First, an $n^-$-type first base layer 2a of low impurity concentration is formed in thickness of fifty to one hundred and several tens $\mu m$ on a $p^+$ type semiconductor substrate for serving as a $p^+$-type collector layer 1.

Figure 1:
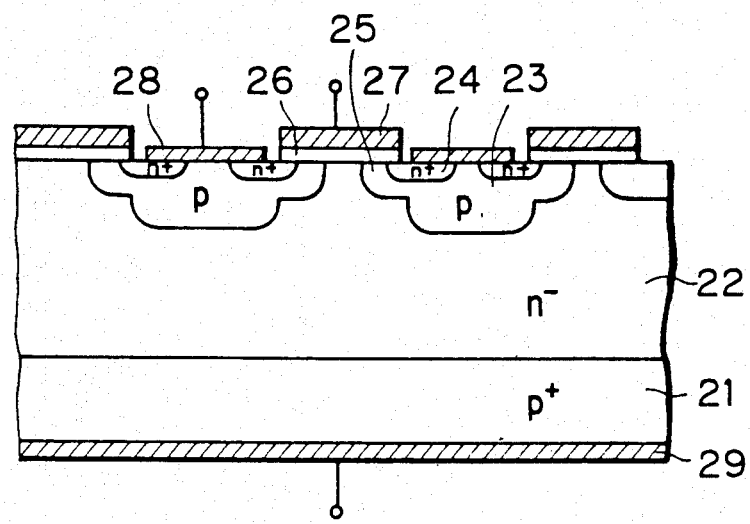
FIG. 1 is a sectional view showing cell structure of a conventional IGBT.
Figure 2A:
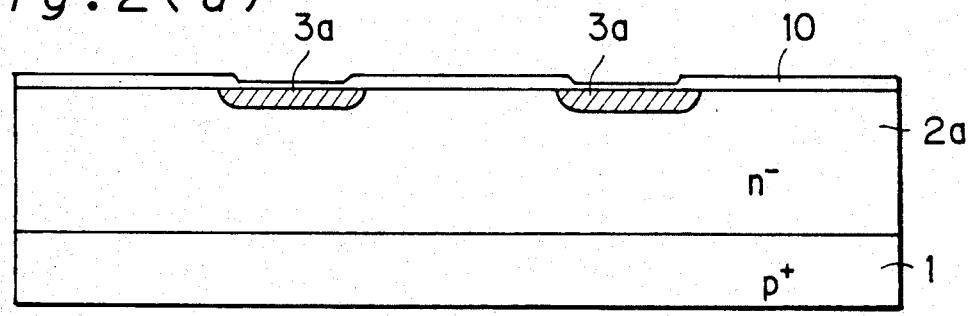
FIGS. 2(a) to 2(f) are sectional views showing cell structure, for illustrating a method of manufacturing an IGBT according to an embodiment of the present invention.

Then, a mask 10 of an oxide film, for example, is formed on the surface of the $n^-$-type first base layer 2a, and thereafter a p-type impurity is selectively doped by a process such as ion implantation, diffusion or the like, to form p-type first well regions 3a of high impurity concentration of about $5 \times 10^{16}$ cm$^{-3}$ to $1 \times$ cm$^{-3}$ in surface concentration, as shown in FIG. 2(a).

Figure 2B:
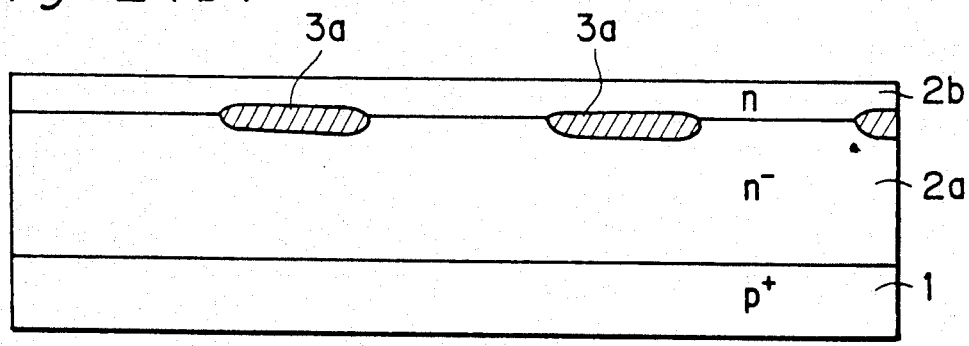

Then, the mask 10 is entirely removed, and an n-type second base layer 2b, being higher in impurity concentration than the $n^-$-type first base layer 2a, is formed by epitaxial growth entirely on the surfaces of the $n^-$-type first base layer 2a and the p-type first well regions 3a, as shown in FIG. 2(b). Thus, a base layer 2 including the first and second base layers 2a and 2b is formed. Thickness of the n-type second base layer 2b is about 5 to 10 $\mu m$ depending on design of collector-to-emitter breakdown voltage. Suitable specific resistance of the n-type second base layer is several $\Omega \cdot cm$ in view of element characteristics, depending on the design of the space between each adjacent pair of p-type well regions 3, depth of p-type well regions 3 relating to collector-to-emitter breakdown voltage and surface concentration of the p-type first well regions 3a.

Figure 2C:
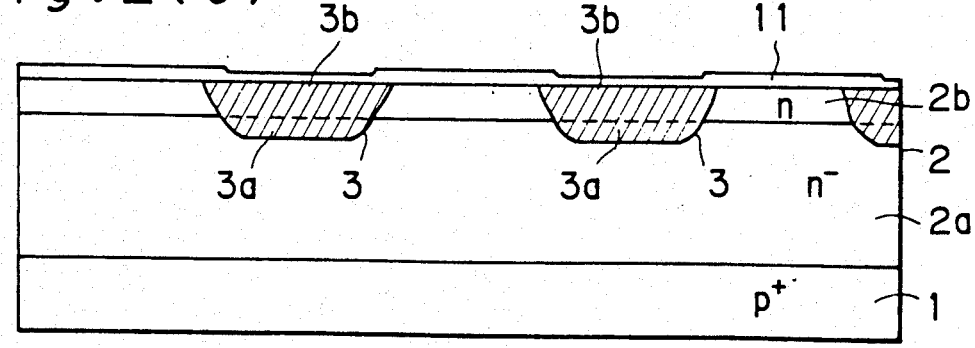

Then, a p-type impurity is selectively diffused on surface portions of the n-type second base region 2b being immediately above the p-type first well regions 3a through a mask 11 of an oxide film, for example, to form p-type second well regions 3b which are lower in impurity concentration than the p-type first well regions 3a, as shown in FIG. 2(c). At this time, the p-type first well regions 3a and the p-type second well regions 3b are coupled with each other through upward diffusion of the impurity in the p-type first well regions 3a under the n-type second base regions 2b, to define p-type well regions 3. Thus, diffusion conditions such as diffusion temperature, time and the like are remarkably reduced as compared with the conventional case. The impurity concentration of the p-type second well regions 3b may be higher than that of the p-type first well regions 3a, if the function of channel portions 4 are not affected by the impurity concentration.

Figure 2D:
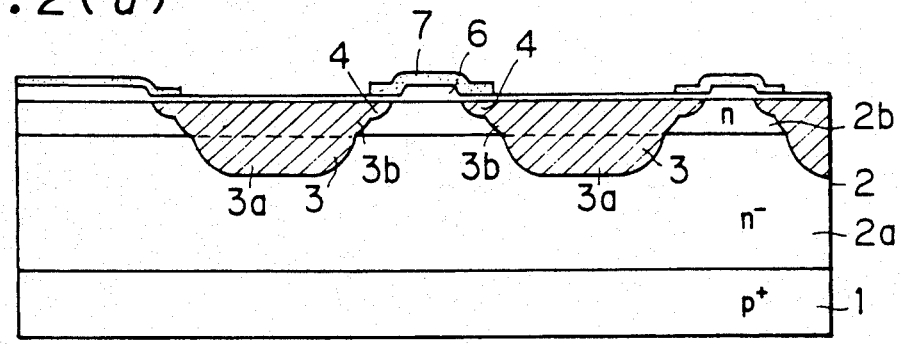

Channel portions 4 are formed by diffusing a p-type impurity on both ends of the respective p-type second well regions 3b in accordance with channel length. Insulation films 6 are formed on the channel portions 4 and portions of the n-type base layer 2b between the p-type well regions 3, as shown in FIG. 2(d). Further, gate electrodes 7 of doped polysilicon, for example, are formed on the insulation films 6.

Figure 2E:
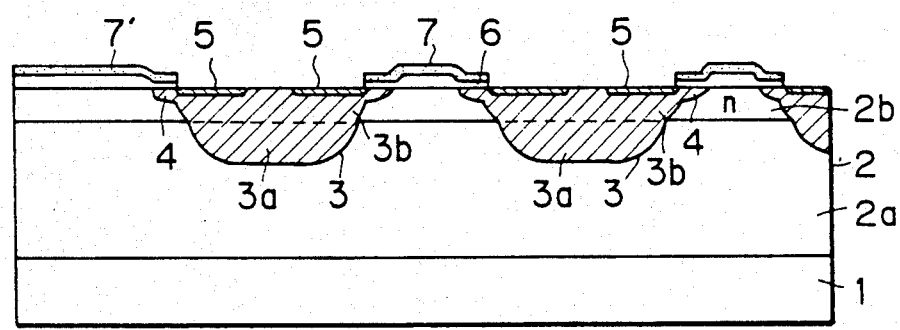

An n-type impurity is selected diffused in the p-type second well regions 3b to form n+-type emitter regions 5 by self-alignment utilizing the gate electrodes 7 of doped polysilicon as masks, as shown in FIG. 2(e).

Figure 2F:
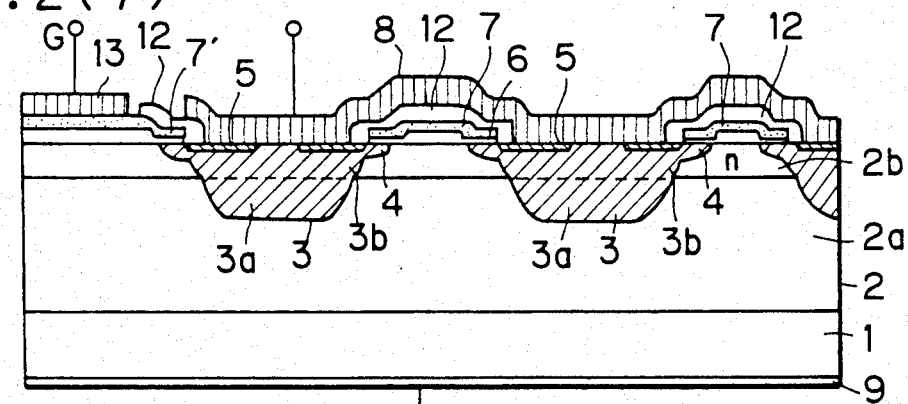

Then all of the gate electrodes 7 are entirely covered with an insulation film 12 while exposing the surface of only a single specific gate electrode 7', and thereafter a metal layer is formed over the entire surface. This metal layer is selectively etched to form a gate extracting portion 13 on the specific gate electrode 7' and an emitter electrode 8 having electrically connecting the n+-type emitter regions 5 and the p-type well regions 3 with each other for preventing a latch up phenomenon, as shown in FIG. 2(f). Thus, a complete IGBT is manufactured through the aforementioned steps.

In this IGBT, the base layer 2 has the n-type second base layer 2b above bottom portions of the p-type well regions 3. Since the n-type second base layer 2b is in high impurity concentration, a depletion layer by p-n junction defined between the n-type base layer 2b and the p-type well regions 3b does not so spread in the n-type base layer 2b. Thus, the JFET effect, causing increase in ON-state voltage, can be prevented, and hence it becomes possible to reduce the cell space.

Further, the p-type first well regions 3a of high impurity concentration are provided in bottom portions of the p-type well regions 3, whereby minority carriers from the base layer 2 flow in concentration to the bottom portions of the p-type well regions 3 having small resistance values. Thus, parasitic bipolar transistors formed by the n+-type emitter regions 5, the p-type well regions 3 and the base layer 2 are hardly turned on, whereby a latch up phenomenon can be effectively prevented.

In other words, diffusion of the p-type first well regions 3a of high impurity concentration is performed from the surface of the n⁻-type first base layers 2a, so that vertical resistance in the p-type well regions 3 can be sufficiently lowered, whereby the latch-up phenomenon can be effectively prevented.

Moreover, the impurity diffusion upward from the first well regions 3a results in lowering the resistivity of the well regions 3 under the n+-type emitter regions 5 without affecting the concentration of impurity at the channel portions 4. This also effectively prevent the latch-up phenomenon.

According to the manufacturing method in accordance with the present invention, the p-type well regions 3 are formed by coupling the p-type first well regions 3a of high impurity concentration provided in the n⁻-type first base layer 2a with the p-type second well regions 3b formed in the n-type second base layer 2b epitaxially grown on the n⁻-type first base layer 2a. Therefore, the deep p-type well regions 3, which are indispensable to implement a device of high breakdown voltage, can be formed without performing heat treatment in a high temperature and a long time, which causes a defect such as thermal distortion. Further, the p-type first well regions 3a, the p-type second well regions 3b, the n⁻-type first base layer 2a and the n-type second base layer 2b can be controlled in impurity concentration respectively, whereby a semiconductor device of various characteristics can be easily obtained.

The n⁻-type first base layer 2a is of low impurity concentration similarly to a conventional n⁻-type base layer, and hence sufficiently high breakdown voltage can be obtained.

Figure 3:
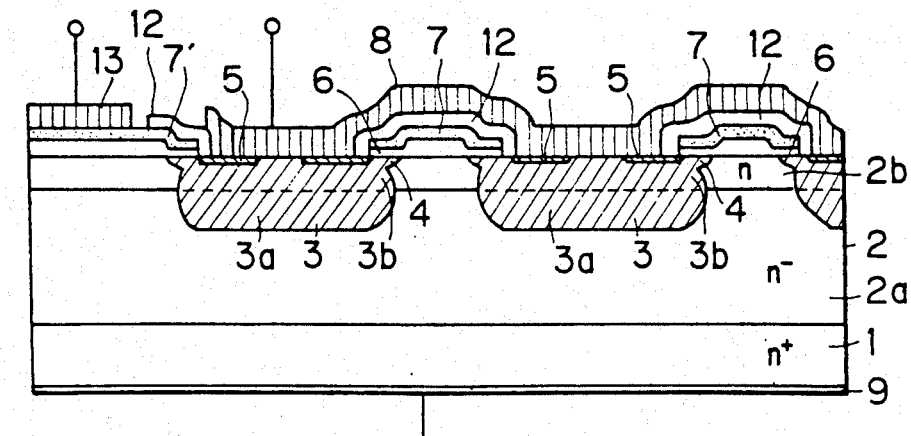
FIG. 3 is a sectional view showing cell structure of an IGBT according to another embodiment of the present invention.

Although the p-type second well regions 3b are larger in diffusion pattern size than the p-type first well regions 3a. in the p-type well regions 3 in the above embodiment, the p-type first well regions 3a may be wider than or substantially identical in size to the p-type second well regions 3b, as shown in FIG. 3, in view of preventing a latch-up phenomenon, so far as the specific resistance of the n⁻-type first base layer 2a is optimized in order to prevent the JFET effect between the p-type well regions 3.

The second base layer 2b may not necessarily be set in high impurity concentration, in view of forming the p-type well regions 3, to obtain high breakdown voltage and effectively prevent a latch-up phenomenon, without causing thermal distortion or the like. On the other hand, in view of preventing the JFET effect, there is no need to provide difference in impurity concentration between the p-type first and second well regions 3a and 3b.

The effect of preventing a latch up phenomenon can be further improved by forming the p-type second well regions 3b through two diffusion steps to set regions other than those close to the channel portions 4 in high impurity concentration to reduce the vertical resistance.

Although the above embodiment& has been described with respect to an n-channel insulated gate bipolar transistor, the present invention Is not restricted to this but is also applicable to a p-channel insulated gate bipolar transistor, as well as to a vertical MOS transistor and the like.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
 a first semiconductor layer of a first conductivity type formed on a surface of said first semiconductor layer;
 a third semiconductor layer of a second conductivity type formed on a surface of said second semiconductor layer, said third semiconductor layer being higher in impurity concentration than said second semiconductor layer;
 a well region of the first conductivity type formed in at least said third semiconductor layer;
 a semiconductor region of the second conductivity type formed in a surface of said well region separately from said third semiconductor layer;
 an insulation film formed on the surface of said well region between said semiconductor region and said third semiconductor layer;
 a control electrode formed on a surface of said insulation film;
 a first electrode formed on said semiconductor region and said well region; and
 a second electrode formed on a back surface of said first semiconductor layer.

2. A semiconductor device comprising:
 a first semiconductor layer of a first conductivity type;

a second semiconductor layer of a second conductivity type formed on a surface of said first semiconductor layer;

a third semiconductor layer of a second conductivity type formed on a surface of said second semiconductor, said third semiconductor layer being higher in impurity concentration than said second semiconductor layer;

a well region of the first conductivity type formed in said second and third semiconductor layers, consisting of only a lower part formed in said second semiconductor layer and an upper part formed in said third semiconductor layer, said lower part being higher in impurity concentration than said upper part;

a semiconductor region of the second conductivity type formed in a surface of said well region separately from said third semiconductor layer;

an insulation film formed on the surface of said well region between said semiconductor region and said third semiconductor layer;

a control electrode formed on a surface of said insulation film;

a first electrode formed on said semiconductor region and said well region; and a second electrode formed on a back surface of said first semiconductor layer.

3. A semiconductor device comprising:

a first semiconductor layer of a first conductivity type which serves as a collector region;

a second semiconductor layer of a second conductivity type formed on said first semiconductor layer;

a third semiconductor layer of the second conductivity type which is formed on and in direct to contact with said second semiconductor layer and has an impurity concentration higher than said second semiconductor layer, said third semiconductor layer together with said second semiconductor layer serving as a base region;

a first semiconductor region of the first conductivity type formed to extend from a surface of said third semiconductor layer to an inner portion of said second semiconductor layer;

a second semiconductor region of the second conductivity type which is formed in a surface of said first semiconductor region and serves as an emitter region, a portion of the surface of said first semiconductor region between surfaces of said third semiconductor layer and said second semiconductor region being defined as a channel region;

an insulation film formed on said channel region;

a collector electrode formed on and electrically connected to said first semiconductor layer;

a emitter electrode formed on and electrically connected to said second semiconductor region; and a gate electrode formed on said insulation film.

4. A semiconductor device in accordance with claim 2, wherein said lower part of said well region is larger than said upper part of said well region.

5. A semiconductor device in accordance with claim 2, wherein
said semiconductor device includes an insulated gate bipolar transistor,
said first semiconductor layer includes a collector layer,
said second semiconductor layer includes a base layer,
said semiconductor region includes an emitter region,
said control electrode includes a gate electrode,
said first electrode includes an emitter electrode and said second electrode includes a collector electrode.

6. A semiconductor device in accordance with claim 2, wherein said first conductivity type is p-type and said second conductivity type is n-type.

7. A semiconductor device in accordance with claim 2, wherein said first conductivity type is n-type and said second conductivity type is p-type.

8. A semiconductor device in accordance with claim 3, wherein
said third semiconductor layer includes an epitaxial layer.

9. A semiconductor device in accordance with claim 3, wherein
said first semiconductor region has a higher impurity concentration in a portion corresponding to the inner portion of said second semiconductor layer than that in a portion corresponding to a surface portion of said third semiconductor layer.

10. A semiconductor device in accordance with claim 8, wherein
said third semiconductor layer is about 5 to 10 $\mu$m in thickness.

11. A semiconductor device in accordance with claim 8, wherein
said third semiconductor layer is several $\omega \cdot$cm in specific resistance.

* * * * *